United States Patent [19]

Nakajima

[11] Patent Number: 5,353,253

[45] Date of Patent: Oct. 4, 1994

[54] SEMICONDUCTOR MEMORY DEVICE

[75] Inventor: Michio Nakajima, Itami, Japan

[73] Assignee: Mitsubishi Denki Kabushiki Kaisha, Tokyo, Japan

[21] Appl. No.: 126,636

[22] Filed: Sep. 27, 1993

[30] Foreign Application Priority Data

Oct. 14, 1992 [JP] Japan ................. 4-275796

[51] Int. Cl.⁵ .............. G11C 7/00; G11C 11/40
[52] U.S. Cl. ............... 365/200; 365/225.7; 371/10.2
[58] Field of Search ............. 365/200, 225.7; 307/10.1, 10.2

[56] References Cited

U.S. PATENT DOCUMENTS

| | | | |
|---|---|---|---|
| 4,376,300 | 3/1993 | Tsang | 365/200 |
| 4,428,068 | 1/1984 | Baba | 365/200 |
| 4,744,060 | 5/1988 | Okajima | 365/200 |
| 4,757,474 | 7/1988 | Fukushi et al. | 371/10.2 |
| 5,179,536 | 1/1993 | Kasa et al. | 365/200 |
| 5,206,831 | 4/1993 | Wakamatsu | 365/200 |

FOREIGN PATENT DOCUMENTS 0273300  11/1989  Japan ................. 365/200

Primary Examiner—Eugene R. LaRoche
Assistant Examiner—Son Dinh
Attorney, Agent, or Firm—Oblon, Spivak, McClelland, Maier & Neustadt

[57] ABSTRACT

A smaller, high-speed, semiconductor memory device having redundancy is disclosed which attains an improved mass productivity. Where a main memory (20) includes a defective memory cell, a defective address designating circuit (21) stores the address of the defective memory cell. Defective address detecting circuits (22a to 22r) detect whether an address signal received at an address signal input terminal (4) coincides with an address signal from the defective address designating circuit (21). If a signal indicative of the coincidence is given to a redundancy memory circuit (23) from the defective address detecting circuits (22a to 22r), data is written in or read from defective address remedy latch circuit groups (23a to 23r) of the redundancy memory circuit (23) which correspond to the defective address detecting circuits (22a to 22r). A data selector (24) selectively outputs data received from the defective address remedy latch circuit groups (23a to 23r) or data received from the main memory (20). Thus, the redundancy memory circuit (23), which requires less space, quickly replaces the defective memory cell of the main memory (20).

17 Claims, 9 Drawing Sheets

SEMICONDUCTOR MEMORY DEVICE

BACKGROUND OF THE INVENTION

1. Field of the Invention

The present invention relates to a redundancy circuit which is used in a semiconductor memory device to prevent a defective memory medium from interfering with operation of the semiconductor memory device. In particular, the present invention relates to a technique for obtaining a smaller and faster redundancy-circuit equipped with semiconductor memory device.

2. Description of the Prior Art

In most cases, when a semiconductor memory device includes one or two defective memory cells in a memory cell array, i.e., if there is defect of a few bits, the semiconductor memory device becomes defective. Even with defect of a few bits, a semiconductor memory device is labelled as a substandard product. A semiconductor memory device having redundancy is a semiconductor memory device which comprises a redundancy circuit which compensates for defect of a few bits.

FIG. 9 is a block diagram of a conventional semiconductor memory device. In FIG. 9, indicated at numerical reference 1 is a data input terminal for receiving data which is to be stored $D_{in}$, indicated at 2 is a write signal input terminal for receiving a write enable signal WE under the control of which data is written and read, and indicated at 3 is a data output terminal for outputting stored data $D_{out}$. Indicated at 4 is an address signal input terminal for receiving an address signal AD which designates the address of a memory location which is specified by a row and a column of the inputted data $D_{in}$ and the stored data to be outputted $D_{out}$. Indicated at 5 is a memory cell array housing arrays of memory cells for storing the data $D_{in}$ which has been stored at an address which is specified with a row and a column by the address signal AD and for outputting the stored data $D_{out}$. Indicated at 6 is a row decoder which is connected to the address signal input terminal 4 and which double signs a row address signal of a address signal AD received therein in order to designate the row of an address. At reference number 7 word lines are indicated which are connected to the row decoder 6 and the memory cells of the memory array 5 so as to transfer a signal which controls the memory cells. At reference number 8, a defective row address signal generation circuit is shown which includes a plurality of fuses. By blowing the fuses with a laser or the like, the defective row address signal generation circuit 8 generates a row address signal which tells which row includes a defective memory cell. Indicated at 9 is a defective row address signal detection circuit which is connected to the defective row address signal generation circuit 8 and the address signal input terminal 4. The defective row address signal detection circuit 9 judges whether a row address signal received therein coincides with the defective row address signal and designates a spare row if the two signals coincide with each other. Indicated at 10 is a spare word line connected to both spare row memory cells and the defective row address signal detection circuit 9 and which transmits a signal which controls the spare memory cells. At numerical reference 11 are indicated fuses which are provided in the word lines 7 and the spare word line 10. The fuses 11 are to be blown to prohibit transfer of the control signal from the row decoder 6 or the defective row address signal detection circuit 9 to the memory cells or the spare memory cells. Indicated at 12 is a column decoder which is connected to the address signal input terminal 4 and which double signs a column address signal of an address signal AD received therein in order to designate the column of an address. Indicated at 14 is a column selector connected to the column decoder 12. In response to a signal received from the column decoder 12, the column selector 14 selects a bit line 13 to attain data transfer between the data input terminal 1 and the selected bit line 13 or between the data output terminal 3 and the selected bit line 13. The bit lines 13 are connected to the memory cells of the memory cell array 5 to transmit the data $D_{in}$ or the data $D_{out}$ to the memory cells. Indicated at 15 is a defective column address signal generation circuit which includes a plurality of fuses. By blowing the fuses with a laser or the like, the defective column address signal generation circuit 15 generates a column address signal which tells which column includes a defective memory cell. Indicated at 16 is a defective column address signal detection circuit which is connected to the defective column address signal generation circuit 15 and the address signal input terminal 4. The defective column address signal detection circuit 16 judges whether a column address signal received therein coincides with the defective column address signal and designates a spare column if the two signals coincide with each other. Indicated at 17 is a spare bit line which is connected to spare column memory cells and the column selector 14. The spare bit line 17 attains transfer of the data $D_{in}$ which is to be stored in the spare memory cells or the data $D_{out}$ which is to be read from the spare memory cells. At numerical reference 18 fuses are indicated which are provided in the bit lines 13 and the spare bit line 17. The fuses 18 are to be blown to disconnect the column selector 14 from the memory cells or the spare memory cells so that the data $D_{in}$ or the data $D_{out}$ would not be transferred. A semiconductor memory device is indicated at numerical reference 20a.

Next, description will be given on the state of a semiconductor memory device 20a where there is no defective memory cell in the memory cell array 5. When the memory cell array 5 does not include a defective memory cell, the fuses 11 of the spare word line 10 and the fuses 18 of the spare bit line 17 are blown, consequently preventing the control signal from routed from the defective row address signal detection circuit 9 to the memory cells of the spare row through the spare word line 10. At the same time, the spare bit line 17 is prevented from selected by the defective column address signal detection circuit 16. Hence, only the memory cell which is addressed by the row decoder 6 and the column decoder 12 will be effective.

Now, description will be given on the state of the semiconductor memory device 20a where the memory cell of the row a and the column b of the memory cell array 5 is found defective in a test step. When the memory cell array 5 thus includes a defective memory cell, two methods remain open to protect the semiconductor memory device 20a against the defect.

The first method is "bit line remedy method." In the bit line remedy method, the fuse 18 on the bit line 13 of the column b and the fuse 11 provided on the spare word line 10 are blown. Next, the fuses in the defective column address signal generation circuit 15 are blown such that the defective column address signal generation circuit 15 generates a column address signal which designates the column b. Once set as above, the semiconductor memory device 20a demands that, for example, when the column address signal included in the address signal AD received from the address signal input terminal 4 designates not the column b but a column n, the column decoder 12 outputs a signal which designates the column n to the column selector 14 and that the defective column address signal detection circuit 16 finds that the column n does not coincide with the column b and outputs a signal which calls for deselection of the spare bit line 17. Thus, the column selector 14 selects only the bit line 13 of the column n so that the memory cell connected to the column n becomes accessible.

Where the semiconductor memory device is set as above, when the address signal AD inputted at the address signal input terminal 4 includes a column address signal which designates the column b, the column decoder 12 provides with the column selector 14 a signal which designates the column b while the defective column address signal detection circuit 16, detecting that there is coincidence at the column b between the column address signal received from the address signal input terminal 4 and the column address signal outputted by the defective column address signal generation circuit 15, outputs to the column selector 14 a signal which demands the column selector 14 to select the spare bit line 17. The column selector 14 then selects both the bit line 13 of the column b and the spare bit line 17 on the column b at the same time. However, since the fuse 18 provided on the bit line 13 of the column b is blown, the memory cell connected to the bit line 13 of the column b is not accessed and instead the memory cell connected to the spare bit line 17 is accessed. Thus, by using the spare memory cell which is connected to the spare bit line 17 instead of the defective memory cell which is connected to the bit line 13 and the column b, the semiconductor memory device 20a is prevented from becoming defective due to the internal defective memory cell.

The second method is "word line remedy method." In this method, the fuse 11 provided on the word line 7 of the row a and the fuse 18 provided on the spare bit line 17 are blown. Likewise in the bit line remedy method, by using the spare word line 10 instead of the word line 7 of the row a connected to the defective memory cell, the semiconductor memory device 20 is protected against the defective memory cell.

Having such a construction, the conventional semiconductor memory device needs a line-basis remedy method in which a row as a whole or a column as a whole has to be replaced to replace a single defective memory cell with a spare memory cell. A semiconductor memory device having a memory capacity of 256K bits can be cited as an example. Suppose that the semiconductor memory device is organized as a 8-bit, 4-column/bit, 16-block memory device, the total bit lines are 512 (8×4×16) and the total spare bit lines are 128 (8×16). Hence, the semiconductor memory device would not comprise redundancy unless the arrays of the memory cells increase in number from 512 to 640, in which case due to the expanded space for the increased memory cell arrays, the chip will become large.

In addition, a delay through the defective row address signal detection circuit 9 or the defective column address signal detection circuit 16 is added to the access time necessary for accessing a spare memory cell instead of a defective memory cell. Thus, accessing of the row or the column of the address of a defective memory cell takes a long time, decelerating the operation speed of the semiconductor memory device.

There is still other problem which relates to incorporation of the redundancy-circuit equipped semiconductor memory device in an application-oriented semiconductor integrated circuit (ASIC). Since the coordinates on which the semiconductor memory device is to be placed are different in different ASICs, and since the number and the locations of the fuses 11 and 18 which are provided in the word lines 7 and 10 and in the bit lines 13 and 17 are different depending on standards of the semiconductor memory device, and further since so are the number and the locations of the fuses of the defective row address signal generation circuit 8 and the defective column address signal generation circuit 15, the locations of the fuses need to be entered and stored in a fuse trimming apparatus for each ASIC. This adversely affects productivity of mass production of the semiconductor memory devices which are to be built in ASICs.

SUMMARY OF THE INVENTION

A semiconductor memory device according to a first aspect of the invention comprises: a data input terminal for receiving data for storage; an address signal input terminal for receiving an address signal which designates an address at which the data is written and from which the data is read; a main memory circuit for receiving the data from the data input terminal and the address signal from the address signal input terminal and for thereafter writing the data at an address which is specified by the address signal or otherwise retrieving the data already stored therein; a defective address specifying circuit for outputting defective address specifying information which specifies an address which corresponds to a defective portion of the main memory circuit; a detection circuit for receiving the address signal and the defective address specifying information respectively from the address signal input terminal and the defective address specifying circuit, for detecting whether the address specified by the address signal coincides with the address specified by the defective address specifying information, and for outputting a detection signal indicative of a result of the detection; a redundancy memory circuit for receiving the detection signal and the data respectively from the detection circuit and the data input terminal and thereafter storing the data about the defective address in response to the detection signal which indicates the coincidence or otherwise outputting the data about the defective address already stored therein; and a data select circuit for receiving the data which is read from the main memory circuit, the data which is outputted from the redundancy memory circuit and the detection signal from the detection circuit and for selectively outputting the data received from the main memory circuit or the data received from the redundancy memory circuit, in accordance with the detection circuit.

In a second aspect of the invention, the redundancy memory circuit is constructed to be capable of storing the data about a plurality of defective addresses and outputting all of the stored data about the defective addresses. The data select circuit comprises: a first select circuit for receiving the data about the plurality of defective addresses at one time from the redundancy memory circuit and for selectively outputting one of the data about the plurality of defective addresses in accordance with the detection signal; and a second select circuit for receiving the data which is retrieved from the main memory circuit and the data which is outputted from the first select circuit and for selectively outputting the data received from the main memory circuit or the data received from the main memory circuit in accordance with the detection signal.

In a third aspect of the invention, the semiconductor memory device of the first aspect is formed on a semiconductor substrate. The defective address specifying circuit comprises: a reference coordinate mark which is formed on the semiconductor substrate to indicate the location of the defective address specifying circuit on the semiconductor substrate; and a fuse element disposed in a predetermined direction with a predetermined distance away from the reference coordinate mark, the fuse element providing the information which specifics the defective portion when selectively conducted or either disconducted by external manipulation.

According to a preferred aspect, in the semiconductor memory device of the first aspect, the data select circuit comprises: a plurality of AND circuits for each receiving at one terminal the data which is retrieved from the redundancy memory circuit or the data which is outputted from the main memory circuit and receiving at the other terminal the detection signal, and for generating a logical product of the data received at the one terminal and an noninverted or an inverted logic of the detection signal; and an OR circuit for receiving output signals of the plurality of the AND circuits and for outputting a logical sum of the output signals of the plurality of the AND circuits.

According to other preferred aspect, in the semiconductor memory device of the first aspect, the redundancy memory circuit comprises latch circuits, each one of the latch circuits storing each bit of the data in accordance with the detection signal, the latch circuits being provided as many as the bit count of the data which is received at the data input terminal.

According to other preferred aspect, in the semiconductor memory device of the first aspect, the redundancy memory circuit comprises: an address generating circuit for generating a redundancy memory circuit inner address signal which specifies an address within the redundancy memory circuit, in accordance with the detection result indicated by the detection signal; and a static random access memory for receiving the redundancy memory circuit inner address signal from the address generating circuit and the data from the data input terminal and for storing the data at the address which is specified by the redundancy memory circuit inner address signal or otherwise outputting the data already stored therein.

In the semiconductor memory device of the third aspect, the reference coordinate mark is any optically readable mark.

Further, in the semiconductor memory device of the third aspect, a plurality of the fuse elements may be provided. The defective address specifying circuit may further comprise: a plurality of binary signal generating circuits connected respectively to the fuse elements, the plurality of binary signal generating circuits each detecting whether its associated fuse element is abled or disabled, generating a binary signal in accordance with the result of the detection and outputting the binary signal; and a plurality of buffer circuits for receiving the outputs of the plurality of binary signal generating circuits and outputting them to the detection circuit.

Further, the defective address specifying information may be generated by the plurality of the binary signal generating circuits which correspond to the fuse elements and by the plurality of the buffer circuits which correspond to the binary signal generating circuits.

Still further, the semiconductor memory device may further comprise flag setting means for setting a flag which is used to select whether the defective address specifying information needs to be outputted or not.

The address input terminal preferably includes terminals which have as many junctions as the bit count of the address signal which has a plurality of bits, the bits of the address signal being inputted at the same time. The detection circuit preferably comprises: a plurality of exclusive OR circuits for each receiving at one input terminal each one of the bits of the address signal from its respective junction of the address signal input terminal and for receiving at the other input terminal the output of its associated binary signal generating circuit; and an AND circuit for receiving outputs of all of the exclusive OR circuits and outputting a logical product of inverted logics of the received outputs received therein as a detection result obtained by the detection circuit.

The signal which is outputted from the flag setting means as the flag may be generated by one of the fuse elements, one of the binary signal generating circuits and one of the buffer circuits.

Further, the binary signal generating circuits may each comprise: a capacitor which is connected between a first power source and a second power source in series with the fuse elements, the first and the second power sources providing different potentials; a resistor which is connected to the capacitor; a transistor having one electrode connected to one end of the resistor, the other electrode connected to the other end of the resistor and a control terminal; and an invertor having an input terminal connected to the other terminal of the transistor and an output terminal connected to the control terminal of the transistor.

The fuse elements may include fuses which can be blown by a laser.

According to a preferred aspect, in the semiconductor memory device of the second aspect, the second select circuit comprises: judging means for judging in accordance with the detection signal whether the address signal which specifies the defective portion of the main memory circuit is received at the address signal input terminal; a first AND circuit for receiving an output signal of the judging means at one input terminal and the data which is retrieved from the main memory circuit at the other input terminal and for generating a logical product of an inverted logic of the output signal of the judging means and the data from the main memory circuit; a second AND circuit for receiving the output signal of the judging means at one input terminal and the data which is retrieved from the redundancy memory circuit at the other input terminal and for generating a logical product of the output signal of the judging means and the data received from the redundancy memory circuit; and an OR circuit for receiving the output signals of the first and the second AND circuits and generating and outputting a logical sum of them.

Further, the first select circuit may comprise: a plurality of third AND circuits for each receiving the data which is outputted from the redundancy memory circuit and the detection signal and for generating a logical product of the data received from the redundancy memory circuit and an noninverted or an inverted logic of the detection signal; and an OR circuit for receiving output signals of all of the third AND circuits and generating and outputting a logical sum of them.

Still further, the judging means may include an OR circuit which receives all of a plurality of bits of the detection signal and generating and outputting a logical sum of them.

Thus, in the first aspect of the invention, during writing of data, the defective address specifying circuit outputs the defective address specifying information which specifies the address of a defective memory cell of the main memory circuit. The detection circuit finds whether there is coincidence between this information and the address signal which is received at the address signal input terminal. If there is coincidence, the detection circuit outputs a detection signal indicative of the coincidence between the address signal and the defective address specifying information such that the redundancy memory circuit holds data which include the same information as that about the defective memory cell. In response to the detection signal indicative of the coincidence, the redundancy memory circuit stores the data which was received at the data input terminal. Also during retrieving of the data already stored therein likewise in writing of the data, if the address signal given to the address signal input terminal specifies the defective memory cell, the defective address specifying circuit and the detection circuit give the redundancy memory circuit a detection signal which indicates that there is coincidence between the address signal and the defective address specifying information so that the redundancy memory circuit reads data which corresponds to the received address signal. The redundancy memory circuit outputs the data which corresponds to the received address signal to the data select circuit. At the same time, the main memory circuit outputs the data which is stored in the defective memory cell to the data select circuit. The data select circuit selectively outputs the data which are received therein. For instance, when received a signal indicative of coincidence between the address signal from the detection circuit and the defective address specifying information, the data select circuit chooses and outputs the data received from the redundancy memory circuit. Hence, unlike the main memory circuit, the novel redundancy memory circuit has a circuit structure which occupies less space in accordance with the number of defective memory cells and which enables high speed operations. The redundancy memory circuit can be easily formed by latch circuits and the like.

Accordingly, reduction in space for the main memory circuit and hence reduction in size of the semiconductor memory device are achieved. Besides, the semiconductor memory device attains shorter access time.

In the second aspect of the invention, in accordance with the detection signal, the first select circuit outputs one of a plurality of data outputted from the redundancy memory circuit. For this reason, the first select circuit is required to be slightly larger. On the other hand, the second select circuit selects the output from the main memory circuit or the output from the first select circuit in accordance with an output from the detection circuit. Hence, the second select circuit can shorten the delay time of the output from the main memory circuit despite its simple circuit structure. The redundancy memory circuit operates faster than the main memory circuit. Therefore, even with the delay time occurred through the first select circuit, the redundancy memory circuit transmits data to the second select circuit faster than main memory circuit.

Hence, not to mention to the effects promised in the first aspect, but even shorter access time is achievable.

In the third aspect of the invention, detection of the defective address specifying circuit is easy due to the reference coordinate mark which is formed on the semiconductor substrate. By confirming from outside the location of the fuse elements using detecting the reference coordinate mark and by enabling or disabling the fuse elements, the defective address designated by the defective address specifying circuit can be specified. In addition, the structure of the defective address specifying circuit needs not to be changed but remains standardized even if the structure of the main memory circuit is changed. Hence, delay in transmission of data from the main memory circuit is suppressed to minimum level.

Thus, the semiconductor memory device according to the third aspect of the invention is constructed for ease of standardization. An excellent mass productivity is promised in manufacturing the semiconductor memory device of the third aspect.

Accordingly, it is an object of the present invention to offer a redundancy semiconductor memory device which has a reduced chip size, which would not invite a delay even with use of a spare memory cell, and hence which promises an excellent productivity in mass production of ASIC incorporating the redundancy semiconductor memory device.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
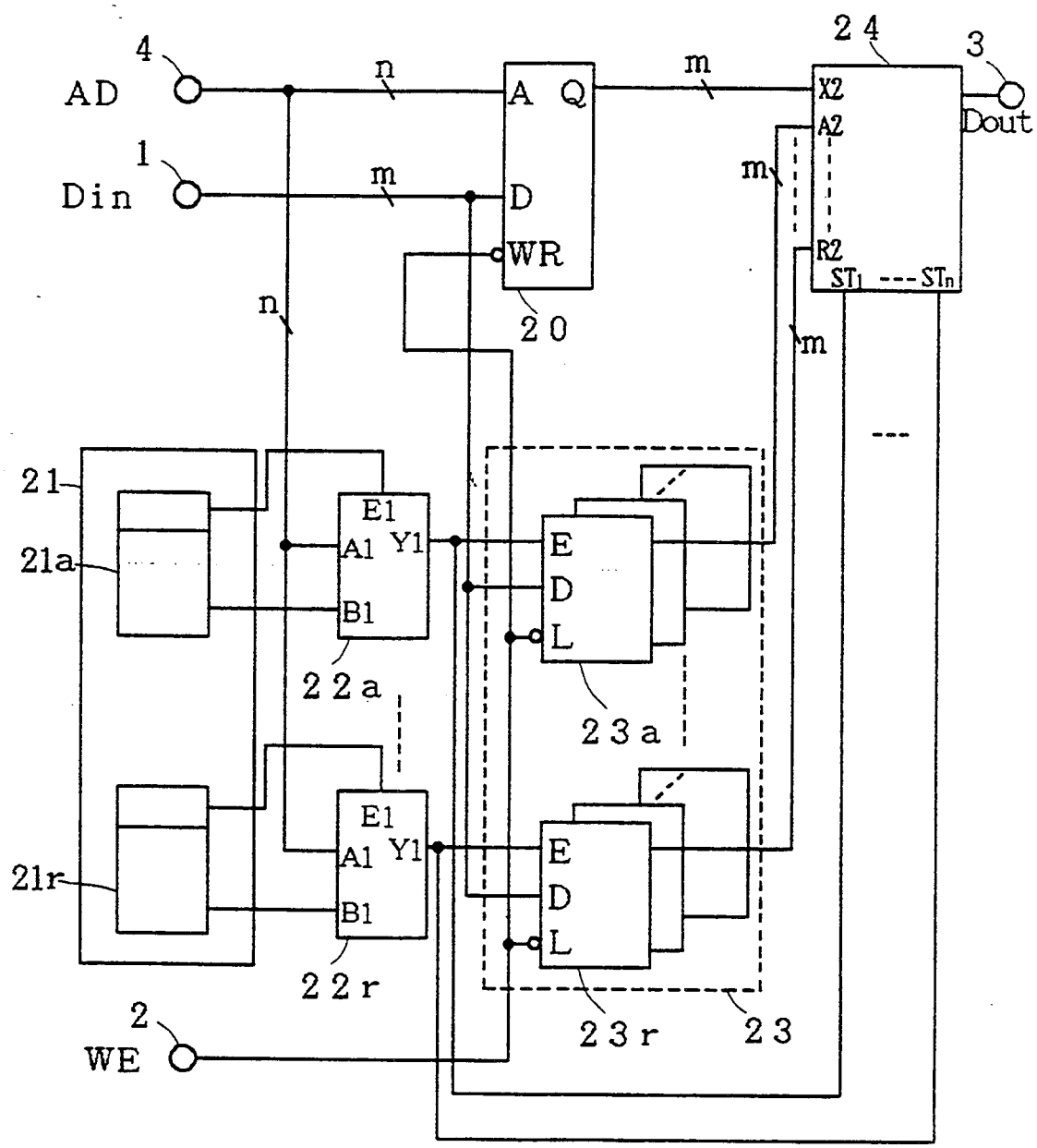
FIG. 1 is a block diagram showing a structure of a semiconductor memory device according to a first preferred embodiment of the present invention.

A first preferred embodiment of the present invention will be described with FIGS. 1 to 7. FIG. 1 is a block diagram showing a structure of a semiconductor memory device having redundancy according to the first preferred embodiment of the present invention. In FIG. 1, indicated at numerical reference 20 is a main memory in which m bits of data $D_{in}$ received via a data input terminal 1 is stored at or outputted from an address which is designated by an n-bit address signal AD which is received via an address signal input terminal 4, in response to a write enable signal WE which is received via a write signal input terminal 2. Indicated at numerical reference 21 is a defective address designating circuit for designating the address of a defective memory cell of the main memory 20. Defective address generating parts are indicated at 21a to 21r each designating an address which corresponds to a defective memory cell. Indicated at numerical references 22a to 22r are defective address detecting circuits. The defective address detecting circuits 22a to 22r each receive the address signal AD from an address signal input terminal 4 and defective address designating information designating a defective address from an associated one of the defective address generating parts 21a to 21r of the defective address designating circuit 21, and detect whether the received address signal AD corresponds to the defective address. Indicated at numerical reference groups 23a to 23r are defective address remedy latch circuit groups. The defective address remedy latch circuit groups 23a to 23r each receive a detection result from an associated one of the defective address detecting circuits 22a to 22r, the data $D_{in}$ from the data input terminal 1, and the write enable signal WE from the write signal input terminal 2, and judge writing and reading states in accordance with the write enable signal WE as the main memory 20 does. Under the control of the detection result outputted from the associated one of the defective address detecting circuits 22a to 22r, the defective address remedy latch circuit groups 23a to 23r each hold the data $D_{in}$ in m latch circuits which are provided for, for example, each bit. A redundancy memory circuit is labeled 23 which is formed by the defective address remedy latches. A data selector is indicated at numerical reference 24 which receives and stores data $D_{out}$ which is outputted from the main memory 20 and, for instance, eighteen different data $D_{out}$ which are outputted from the redundancy memory circuit 23. In accordance with signals $S_1$ to $S_r$ which represent the detection results outputted from the defective address detecting circuits 22a to 22r, the data selector 24 selectively outputs one of the data $D_{out}$ received therein through a data output terminal 3 as an output of the semiconductor memory device.

Operations of the semiconductor memory device will now be described. First in relation to where the main memory 20 does not include a defective memory cell and hence the redundancy memory circuit 23 needs not to function. In this first case, it is not necessary to blow fuse elements of redundancy memory circuit utilization flags for all of the defective address generating parts 21a to 21r of the defective address designating circuit 21. Instead, "1" is outputted as the redundancy memory circuit utilization flags. Receiving "1" as the redundancy memory circuit utilization flag from an associated one of the defective address generating parts 21a to 21r, the defective address detecting circuits 22a to 22r, regardless of the value of the address signal AD inputted thereto, each give the redundancy memory circuit 23 a signal which indicates that the address signal AD is not a defective address. Hence, the redundancy memory circuit 23 would not write thereinto the data $D_{in}$ which has been received from the data input terminal 1 even though the write enable signal WE demands the data $D_{in}$ to be written into. This is also true of reading of data from the redundancy memory circuit 23. The data selector 24, under the control of the signals $S_1$ to $S_r$ given from the defective address detecting circuits 22a to 22r, always selects the data $D_{out}$ which is stored in the main memory 20 and outputs the same through the output terminal 3.

Next, where there is a defective memory cell in the main memory 20 will be described. In this case, it is necessary to blow a required number of fuse elements of redundancy memory circuit utilization flags for the defective address generating parts 21a to 21r of the defective address designating circuit 21 such that an address signal will be generated which represents the defective address. For example, if the defective address is an address No. q, an address signal designating the address No. q must be generated in the defective address generating part 21a. Where the semiconductor memory device is set as above, when the address signal input terminal 4 receives an address signal which designates an address No. p which is not defective, the defective address detecting circuits 22a to 22r all confirm that there is no coincidence between the received address signal AD and the address signals generated by the defective address generating parts 21a to 21r, and output a signal representing absence of coincidence to the redundancy memory circuit 23. Hence, the redundancy memory circuit 23 would not write nor read data. In addition, at this stage, if the write enable signal WE calls for the reading mode, the data selector 24 selects and outputs the data $D_{out}$ which has been outputted from the main memory 20.

On the other hand, when the address signal input terminal 4 receives the address signal AD which designates the defective address No. q, the defective address detecting circuit 22a detects that the address signal AD coincides with the output signal supplied from the defective address generating part 21a, and gives the defective address remedy latch circuit 23a a signal which represents the coincidence. The defective address remedy latch circuit 23a stores the data $D_{in}$ which was inputted from the data input terminal 1 if the write enable signal WE calls for writing of the data. To the contrary, if the write enable signal WE demands the data to be read, the defective address remedy latch circuit 23a outputs the stored data $D_{out}$ to the data selector 24. The data selector 24 then selects, of the data $D_{out}$ which has been received therein, the data $D_{out}$ which was given from the defective address remedy latch circuit 23a, in accordance with the output signals $S_1$ to $S_r$ provided from the defective address detecting circuits 22a to 22r. The data selector 24 thereafter outputs the data it has selected. At this stage, although the main memory 20 is in the process of writing and reading of data in and from the address No. q which is designated by the address signal AD, the data outputted from the main memory 20, failed to be selected by the data selector 24, will never be outputted.

Figure 2:
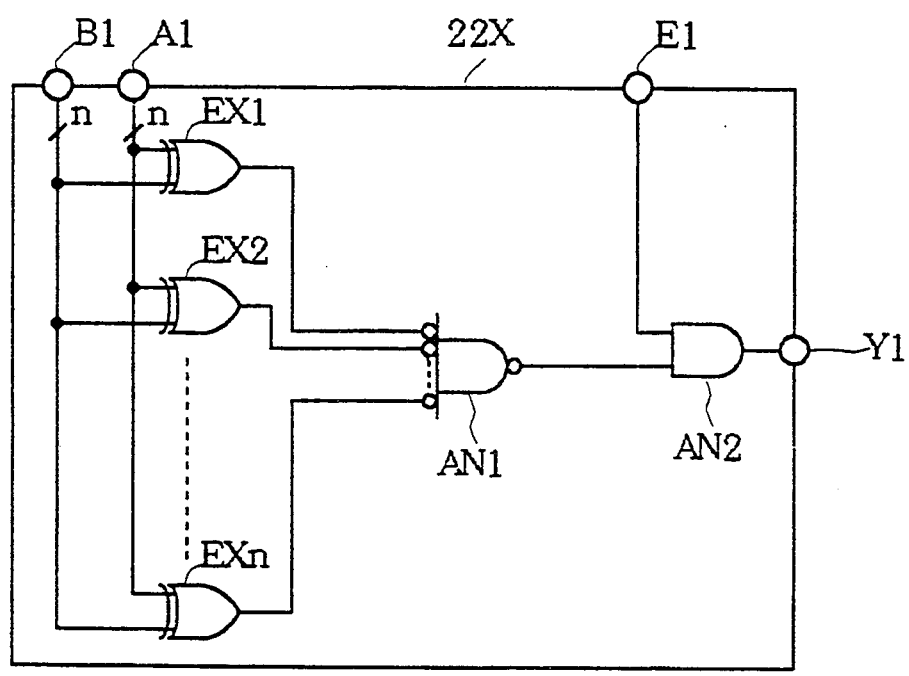
FIG. 2 is a logic circuitry diagram showing a structure of a defective address specifying circuit of semiconductor memory device of FIG. 1.

In the following, the defective address detecting circuits 22a to 22r will be described in more detail in terms of structure while referring to FIG. 2. In FIG. 2, indicated at 22X is a defective address detection circuit, indicated at A1 is an input terminal for receiving the address signal AD from the address signal input terminal 4, and indicated at B1 is an input terminal for receiving the address signal from the defective address generating parts 21a to 21r. Indicated at E1 is an input terminal for receiving the redundancy memory circuit utilization flag for the defective address generating parts 21a to 21r, indicated at Y1 is an output terminal for outputting a detection result, and indicated at EX1 to EXn are exclusive OR circuits for receiving the respective bits of an n-bit address signal via the input terminals A and B and for outputting an exclusive logical sum. At reference character AN1 is indicated an AND circuit for receiving the output signals of the exclusive OR circuits EX1 to EXn and for outputting a logical product of inverted logics of the output signals of the exclusive OR circuits EX1 to EXn. Indicated at AN2 is an AND circuit for outputting a logical sum of the output of the AND circuit AN1 and the signal inputted from the input terminal E1. The relation between signals given to the input terminals A1, B1 and E1 and a signal to be outputted in response from the output terminal Y1 is shown in Table 1 which indicates that when the signal received at the input terminal E1 is "H" and the defective address detection circuit 22X is effective, if signals received at the input terminals A1 and B1 coincide with each other, an "H" signal representing the coincidence is outputted from the output terminal Y1.

TABLE 1

| A1, B1 | E1 | Y1 |
|---|---|---|
| X | L | L |
| A1 = B1 | H | H |
| A1 ≠ B1 | H | L |

*X denotes A = B or A ≠ B

Figure 3:
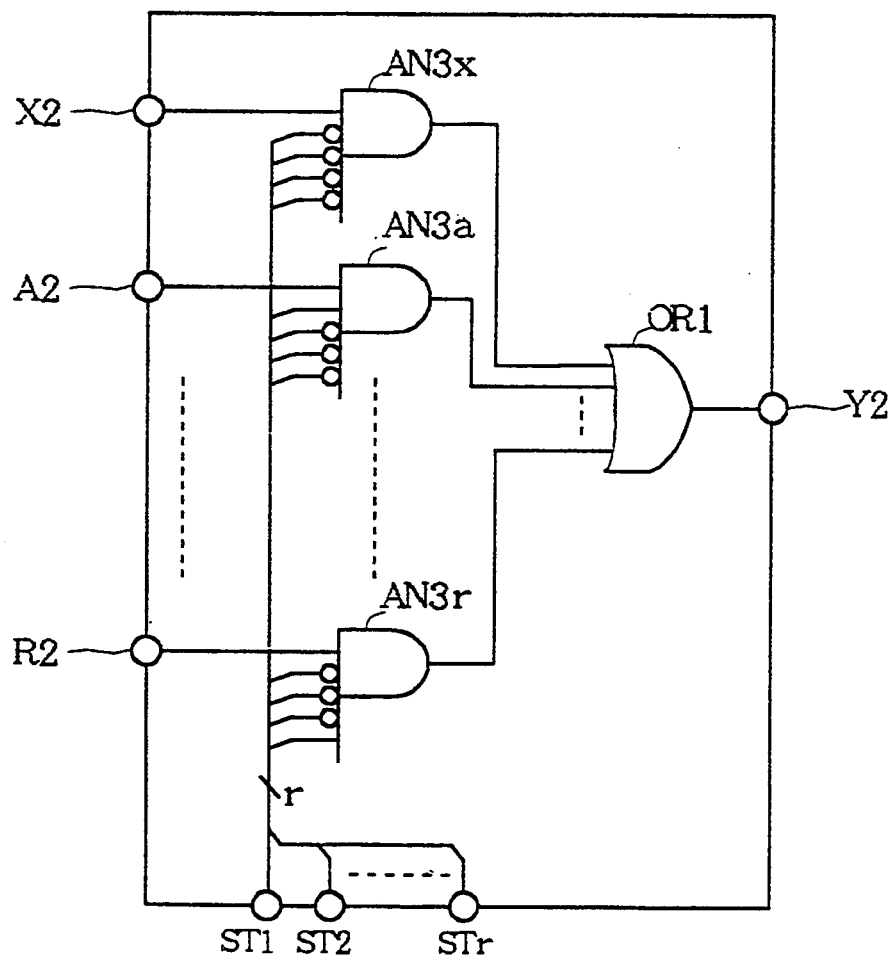
FIG. 3 is a logic circuitry diagram showing a structure of a data selector shown in FIG. 1.

Next, the data selector 24 will be described in detail with FIG. 3 in terms of structure. In FIG. 3, indicated at reference character X2 is an input terminal for receiving the data $D_{out}$ which is outputted from the main memory 20, and indicated at A2 to R2 are input terminals for receiving the data $D_{out}$ which are outputted from the defective address remedy latch circuit groups 23a to 23r of the redundancy memory circuit 23. Indicated at Y2 is an output terminal for outputting selected data. Indicated at $ST_1$ to $ST_r$ are input terminals for receiving the output signals $S_1$ to $S_r$ from the defective address detecting circuits 22a to 22r. Indicated at AN3x is an AND circuit for outputting a logical product of 1 bit of data of the data $D_{out}$ which is received from the main memory 20 through the input terminal X2 and inverted logics of the signals $S_1$ to $S_r$ which are outputted from the defective address detecting circuits 22a to 22r. Indicated at AN3a is an AND circuit for outputting a logical product of 1 bit of data of the data $D_{out}$ which is received from the defective address remedy latch circuit 23a through the input terminal A2, inverted logics of the signals $S_2$ to $S_r$ which are outputted from the defective address detecting circuits 22b to 22r, and the signal $S_1$ outputted from the defective address detecting circuit 22a. Indicated at OR1 is an OR circuit for receiving the output signals of the AND circuits AN3x to AN3r and for outputting a logical sum of these signals. Table 2 shows what signal is outputted from the output terminal Y2 in response to what signals given to the input terminals X2, A2 to R2 and $ST_1$ to $ST_r$. Signals to be received at the input terminals X2 and A2 to R2 are each 1 bit of information of the data $D_{out}$ from the defective address remedy latch circuit groups 23a to 23r. Hence, if the data $D_{out}$ is m-bit data, the number of the circuits of FIG. 3 that are required is m.

TABLE 2

| $S_1$ | $S_2$ | ... | $S_r$ | Y2 |
|---|---|---|---|---|
| H | L | L...L | L | A |
| L | H | L...L | L | B |
| . | . | . | . | . |
| . | . | . | . | . |
| L | L | L...L | H | R |

Figure 4:
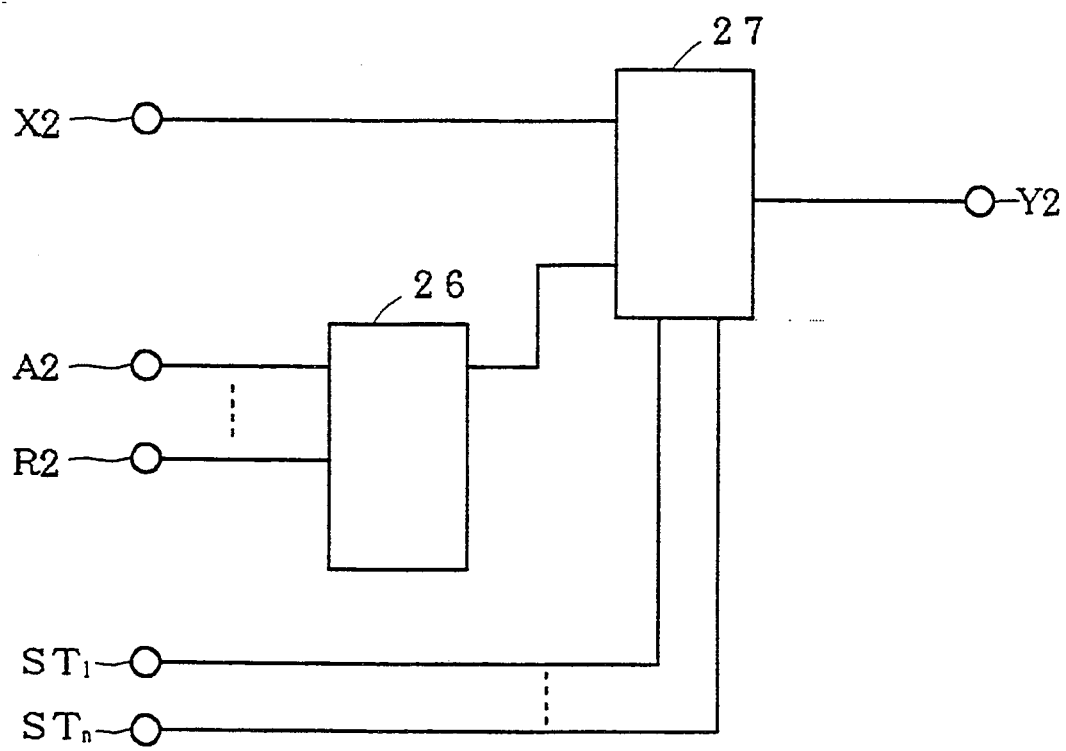
FIG. 4 is a block diagram showing the structure of the data selector shown in FIG. 1.
Figure 5:
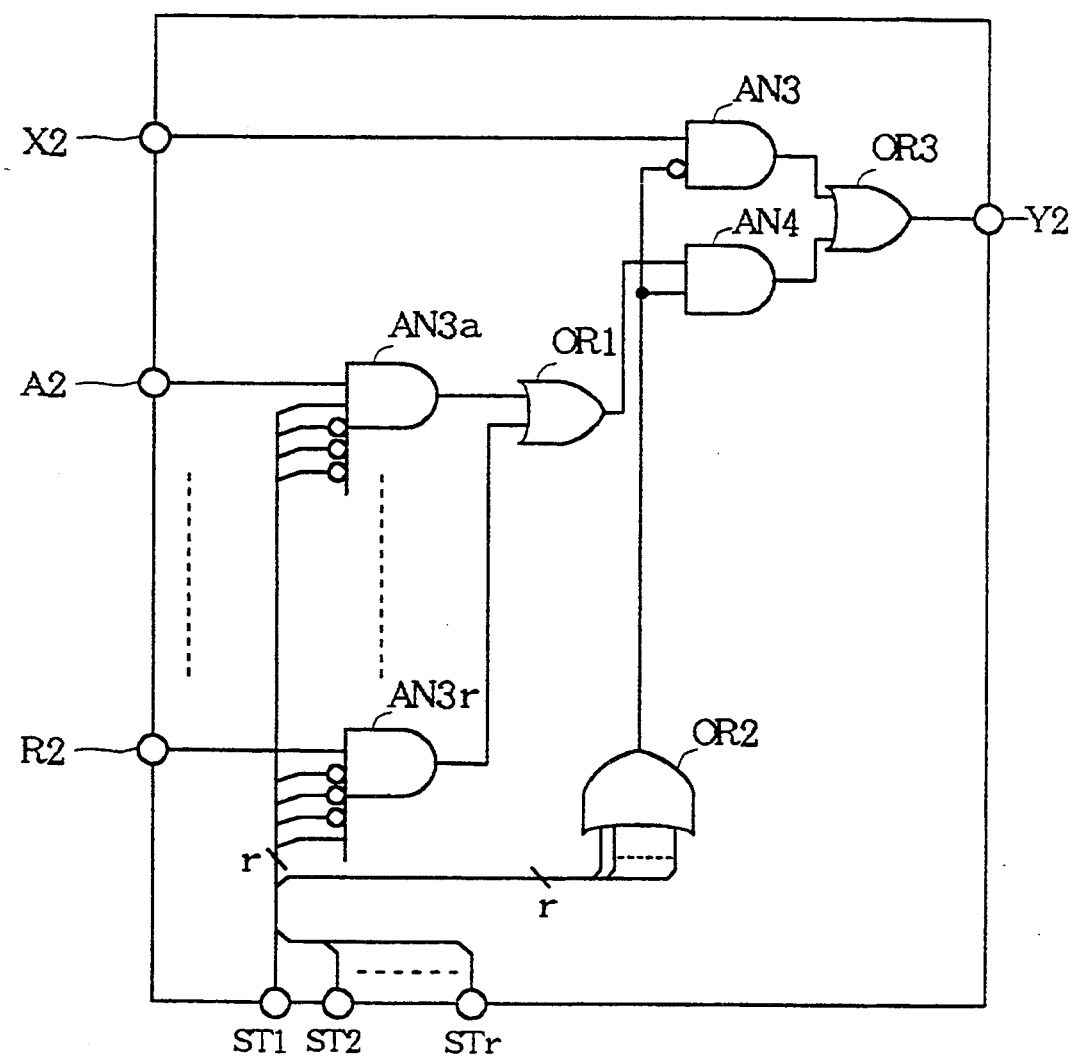
FIG. 5 is a logic circuitry diagram showing a structure of a data selector shown in FIG. 4.

The other embodiment of the data selector 24 is shown in FIG. 4. In FIG. 4, a first data selector is indicated at 26 which receives the data $D_{out}$ from the defective address remedy latch circuit groups 23a to 23r of the redundancy memory circuit 23 through the input terminals A2 to R2 while receiving the signals $S_1$ to $S_r$ through the input terminals $ST_1$ to $ST_r$ from the defective address detecting circuits 22b to 22r, and outputs only the data $D_{out}$ which is outputted from one of the defective address remedy latch circuit groups 23a to 23r. A second data selector is labeled 27 which receives the data $D_{out}$ which is given from the first data selector and the data $D_{out}$ which is outputted from the main memory 20 and outputs either one of the two in accordance with the signals $S_1$ to $S_r$. The structure of the first and the second data selector is shown in FIG. 5. In FIG. 5, indicated at OR2 is an OR gate for receiving the signals $S_1$ to $S_r$ from the input terminals $ST_1$ to $ST_r$ and outputting a logical sum of the signals. Indicated at AN3 is an AND gate which has one input terminal connected to the input terminal X2 and the other input terminal connected to an output terminal of the OR gate OR2. The AND gate AN3 creates and outputs a logical product of the input signal which are received at the input terminal X2 and an inverted logic of the output signal of the OR gate OR2. Indicated at AN4 is an AND gate which has one input terminal connected to an output terminal of the OR gate OR1 and the other input terminal connected to the output terminal of the OR gate OR2. The AND gate AN4 outputs a logical product of the output signal of the OR gate OR1 and output signal of the OR gate OR2. Indicated at OR3 is an OR gate for outputting a logical sum of the outputs of the AND gates AN 3 and AN4. The AND gates AN3 and AN4 and the OR gates OR2 and OR3 of FIG. 5 correspond to the second data selector 27 of FIG. 4, and the other circuitry portion of FIG. 5 corresponds to the first data selector 26 of FIG. 4.

The reason for forming the data selector 24 by two selectors as shown in FIG. 4 is because the second data selector needs to be simple in structure to ensure that the data $D_{out}$ is transferred from the main memory 20 without delay since the main memory 20 operates slower than the redundancy memory circuit 23 and hence the data $D_{out}$ from the main memory 20 is delayed as compared with the data $D_{out}$ from the redundancy memory circuit 23. Here again, signals to be received at the input terminals X2 and A2 to R2 are each 1 bit of information of the data $D_{out}$ from the defective address remedy latch circuit groups 23a to 23r. Hence, if the data $D_{out}$ is m-bit data, the number of the circuits of FIG. 3 that are required is m.

Figure 6:
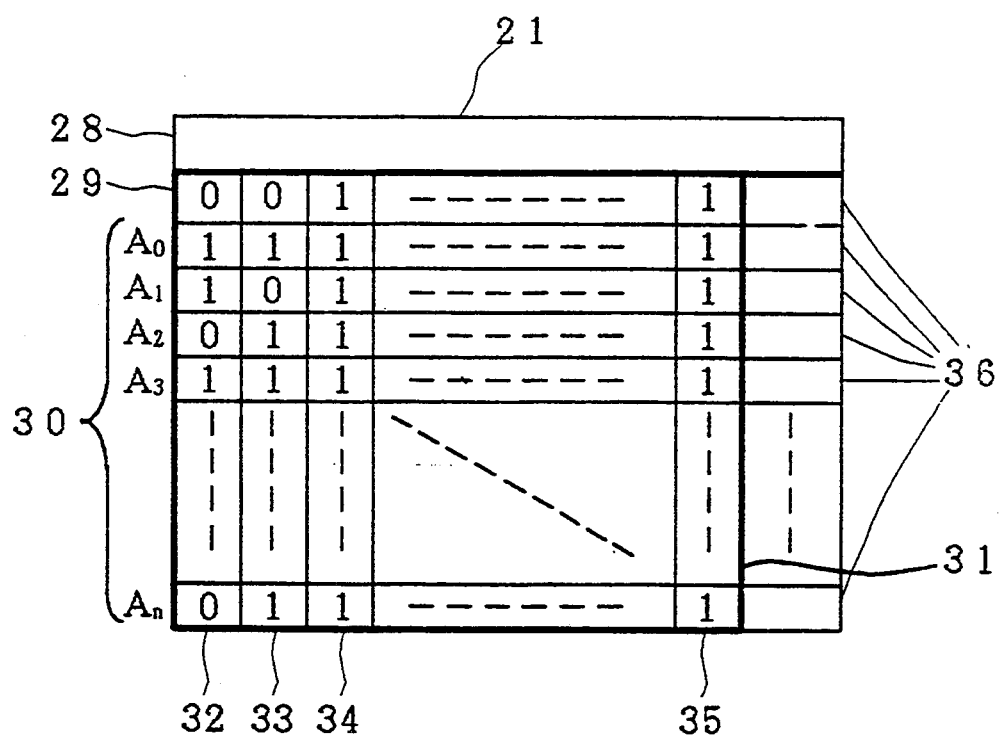
FIG. 6 is a conceptual diagram showing the structure of the defective address specifying circuit of FIG. 1.

Next, the structure of the defective address designating circuit 21 of FIG. 1 will be described with FIGS. 6, 7A and 7B. FIG. 6 is a conceptual diagram showing the structure of the defective address designating circuit. In FIG. 6, indicated at 28 is a reference coordinates detection mark which is optically read to show the location and the direction of the defective address designating circuit on a semiconductor substrate. Indicated at 29 is a redundancy memory circuit utilization flag which serves as a signal to instruct to the defective address detecting circuits 22a to 22r whether there is need for use of the defective address remedy latch circuit groups 23a to 23r of the redundancy memory circuit 23 of FIG. 1. Indicated at 30 is an address signal which is specified by binary codes $A_0$ to $A_n$, indicated at 31 is a fuse circuit array which contains arrays of fuse elements, and indicated at 32 to 35 are each one of the arrays which form the fuse circuit array 31. In the arrays 32 to 35, which correspond to the defective address generating parts 21a to 21r of FIG. 1, respectively, the address of a defective memory cell is generated. A fuse circuit output buffer is indicated at 36 which outputs a signal derived in the fuse circuit array 31 to outside the defective address detecting circuits 22b to 22r and the like. The reference coordinates detection mark 28 is formed on the substrate by etching or other suitable method.

Figure 7A:
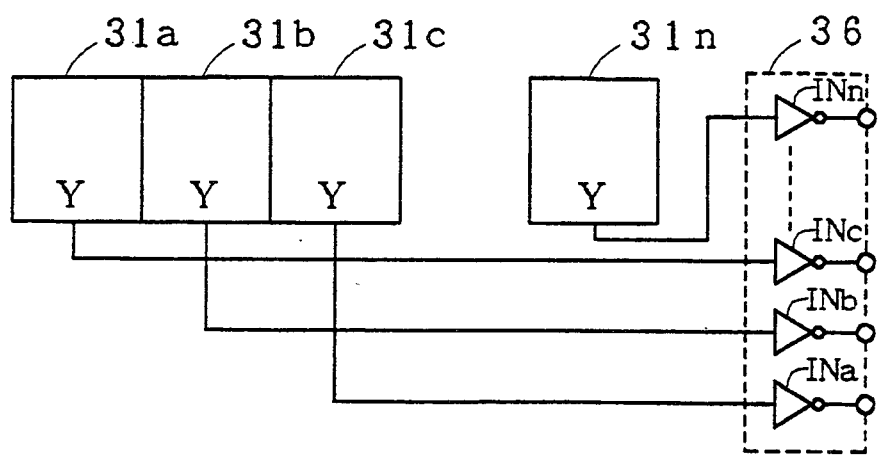
FIGS. 7A and 7B are circuitry diagrams showing the structure of the defective address specifying circuit of FIG. 6.
Figure 7B:
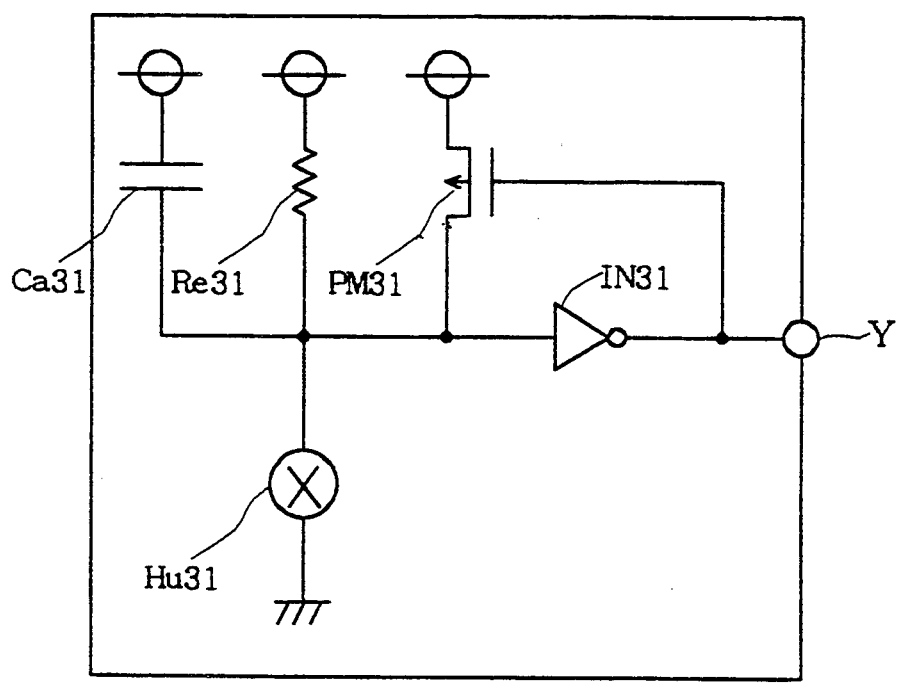

An example of the actual structure of the defective address designating circuit is shown in FIGS. 7A and 7B. FIG. 7A shows one of the arrays of the fuse circuit array 31 of FIG. 6. The fuse circuit array 31 of FIG. 6 is formed by fuse circuits 31a to 31n shown in FIG. 7A. Outputs of the fuse circuits 31a to 31n are outputted outside through invertors INa to INn which serve as a buffer.

The structure of each one of the fuse circuits 31a to 31n is shown in FIG. 7B. For instance, the fuse circuit array 31 is comprised of: a fuse element Hu31 having one grounded terminal; a capacitor Ca31 having one terminal connected to the other terminal of the fuse element Hu31 and the other terminal connected to a power source; a high-resistance resistor Re31 which is connected in parallel to the capacitor Ca31; a P-channel MOS transistor PM31 which is connected in parallel to the capacitor Ca31; and an invertor IN31 which has an input terminal connected to the other terminal of the fuse element Hu31 and which is connected to a gate electrode of the PMOS transistor PM31. When the fuse element Hu31 is blown by laser blowing (laser cutting) or other suitable scheme, charge storage will be created in the capacitor Ca31 through the resistor Re31, thereby increasing a potential at the input terminal of the invertor IN31. With a voltage exceeding a threshold voltage applied thereto, the invertor IN31 outputs an inverted signal, namely, an "L" level signal. This conducts the transistor PM31, whereby the output from the fuse circuit 31 is fixed at "L," that is, "0" in binary level. When the fuse element Hu31 is effective, the output from the fuse circuit 31 is fixed at "H," i.e., "1" in binary level.

However, when outputted through the buffer circuit 36 of FIG. 7A to the defective address designating circuit, the output signal of the fuse circuit 31 is inverted in the buffer circuit 36 before outputted.

Figure 8:
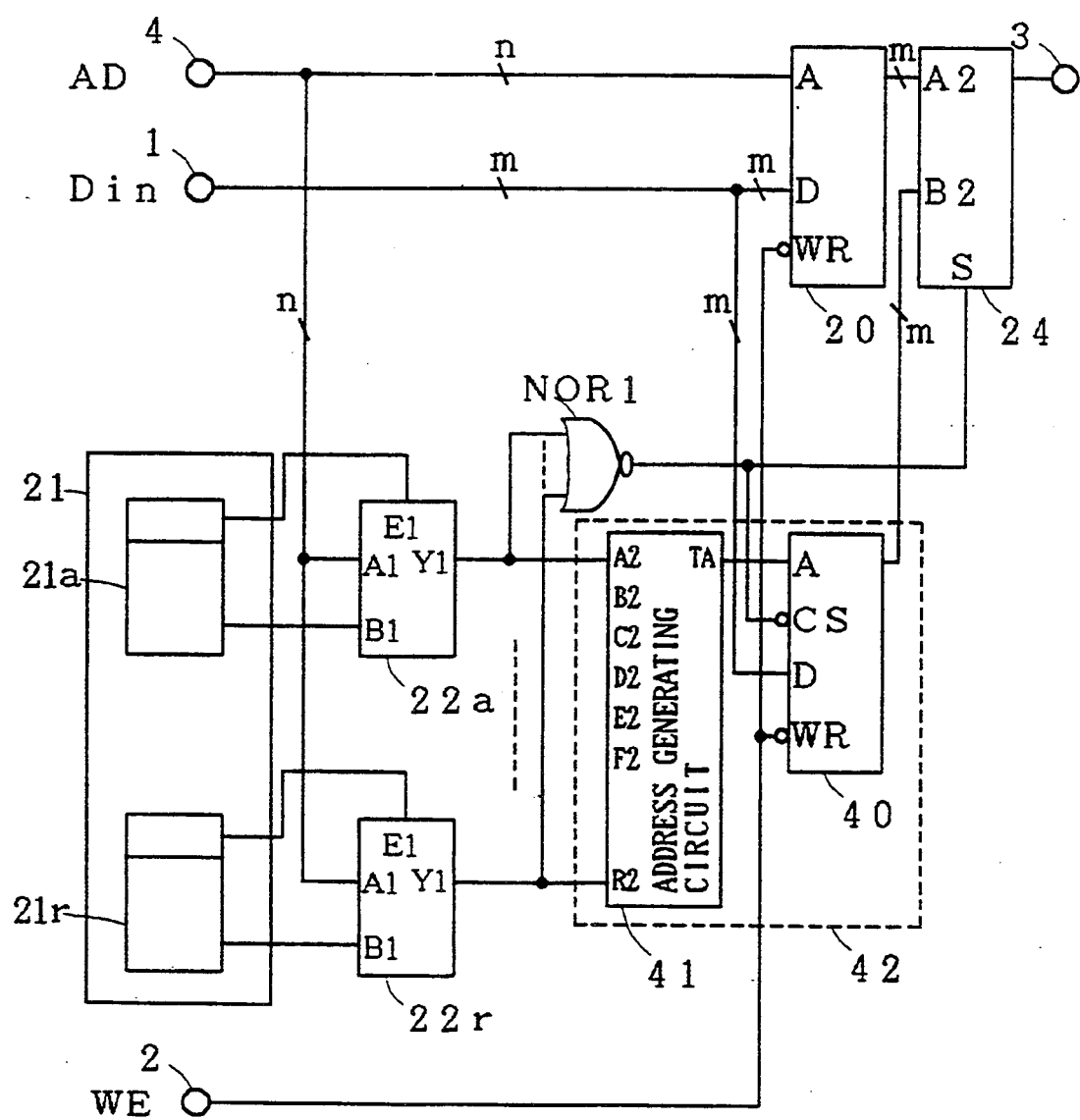
FIG. 8 is a block diagram showing a structure of a semiconductor memory device according to a second preferred embodiment of the present invention.
Figure 9:
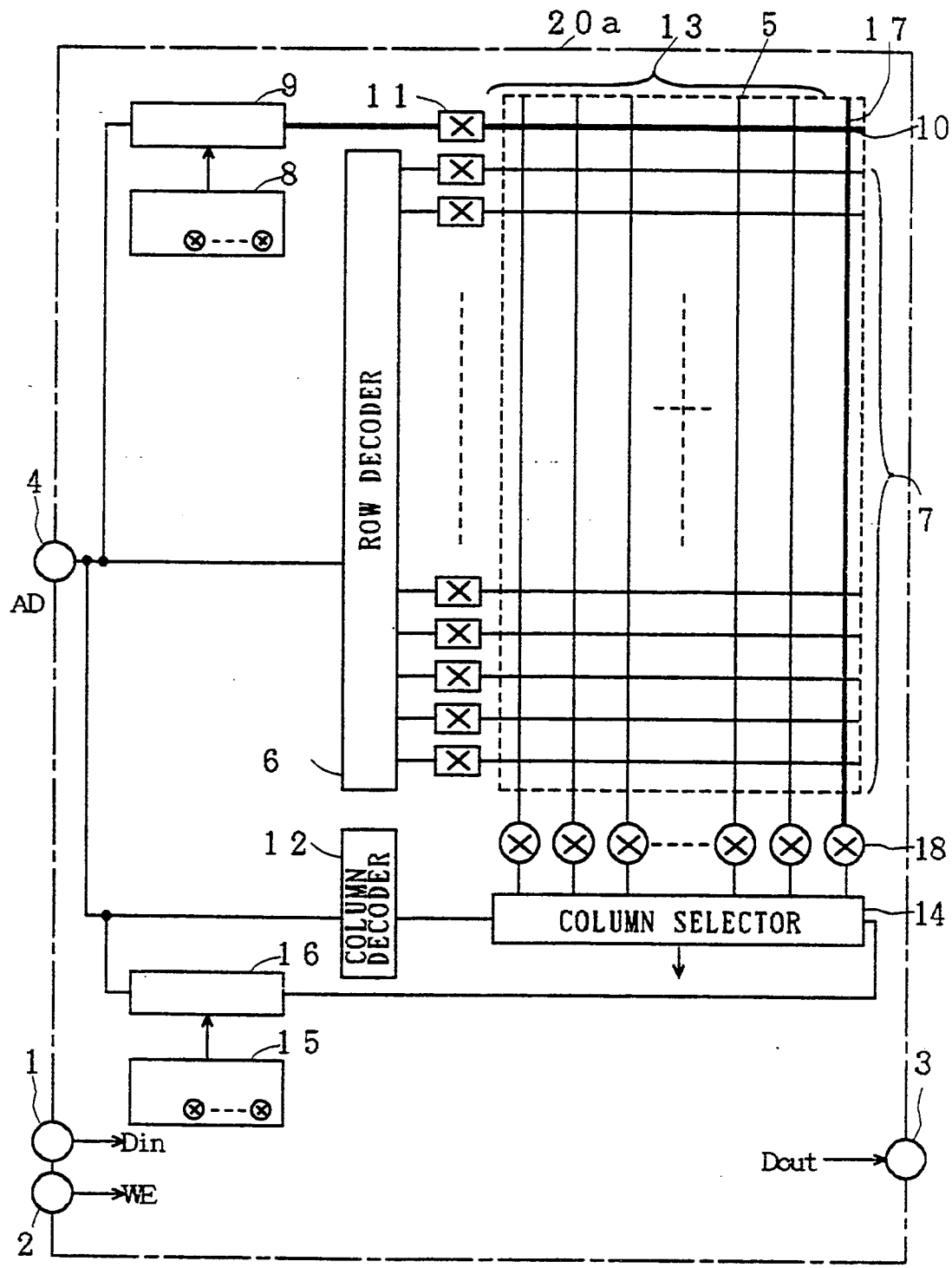
FIG. 9 is a block diagram showing a structure of a conventional semiconductor memory device.

Now, a second preferred embodiment of the present invention will be described with FIG. 8. FIG. 8 is a block diagram showing the structure of a semiconductor memory device having redundancy according to the second preferred embodiment of the present invention. In FIG. 8, indicated at numerical reference 40 is a memory part of a redundancy memory circuit which is formed by a static random access memory (hereinafter "SRAM") and which stores the data about a defective memory cell. Indicated at 41 is an address generating circuit for receiving the output signals of the defective address detecting circuits 22a to 22r and for generating an address signal which designates the address of a memory cell which is to replace the defective memory cell has on the memory cell array 40. Indicated at NOR1 is an NOR gate for receiving the output signals of the defective address detecting circuits 22a to 22r, finding a logical product of these signals and for outputting an inverted logic of the logical product to the data selector 24. A redundancy memory circuit is labeled 42 which is comprised of the memory part 40 and the address generating circuit 41. Parts similar or corresponding to those previously described with FIG. 1 are denoted by like reference characters. In response to an output from the NOR gate NOR1, the data selector 24 of FIG. 8 selects the data $D_{out}$ which is outputted from the main memory 20 or otherwise the data $D_{out}$ which is outputted from the redundancy memory circuit 42.

The SRAM 40 operates generally in the same manner as the main memory 20: under the control of the write enable signal WE received at the write signal input terminal 2, the SRAM 40 stores the data $D_{in}$ which is received at the data input terminal 1 at an address which is designated by the address signal which is received from the address generating circuit 41 or outputs the data as the data $D_{out}$. These operations are faster than the similar operations performed by the main memory 20. A difference regarding operation between the SRAM 40 and the main memory 20 is that the SRAM 40 requires the data $D_{in}$ to be written at an address which is designated by the address generating circuit 41. Thus, unlike the main memory 20 which demands that the address signal AD received at the address signal input terminal 4 is in charge of the addressing, the SRAM 40 needs much less memory capacity and much less complex structure for the address decoder than those necessary in the case of the main memory 20. There is still other point to be noted as to the SRAM 40. That is, the SRAM 40, receiving the output signal of the NOR gate NOR1 at its input terminal CS, is also governed by the output signal of the NOR gate NOR1. The purpose of this is to inhibit an output from the SRAM 40 when there is no coincidence between the output from the defective address designating circuit 21 and the address signal AD which was inputted from the address signal input terminal 4.

The address generating circuit 41 is a commonly used encoder. The relation between an input signal to and an output signal from the address generating circuit 41 is shown in Table 3.

TABLE 3

| INPUT | | | | | | | OUTPUT | | | |
|---|---|---|---|---|---|---|---|---|---|---|
| A2 | B2 | C2 | D2 | E2 | ... | R2 | YA1 | YA2 | YA3 | ... |
| 1 | 0 | 0 | 0 | 0 | ... | 0 | 0 | 0 | 0 | ... |
| 0 | 1 | 0 | 0 | 0 | ... | 0 | 1 | 0 | 0 | ... |
| 0 | 0 | 1 | 0 | 0 | ... | 0 | 0 | 1 | 0 | ... |
| 0 | 0 | 0 | 1 | 0 | ... | 0 | 1 | 1 | 0 | ... |
| 0 | 0 | 0 | 0 | 1 | ... | 0 | 0 | 0 | 1 | ... |
| . | . | . | . | . | ... | . | . | . | . | ... |
| . | . | . | . | . | ... | . | . | . | . | ... |

The foregoing has described that the SRAM is used as the memory part in the second preferred embodiment. However, as far as faster in operation, any other address-designating type memory circuit may be used instead.

While the invention has been described in detail, the foregoing description is in all aspects illustrative and not restrictive. It is understood that numerous other modifications and variations can be devised without departing from the scope of the invention.

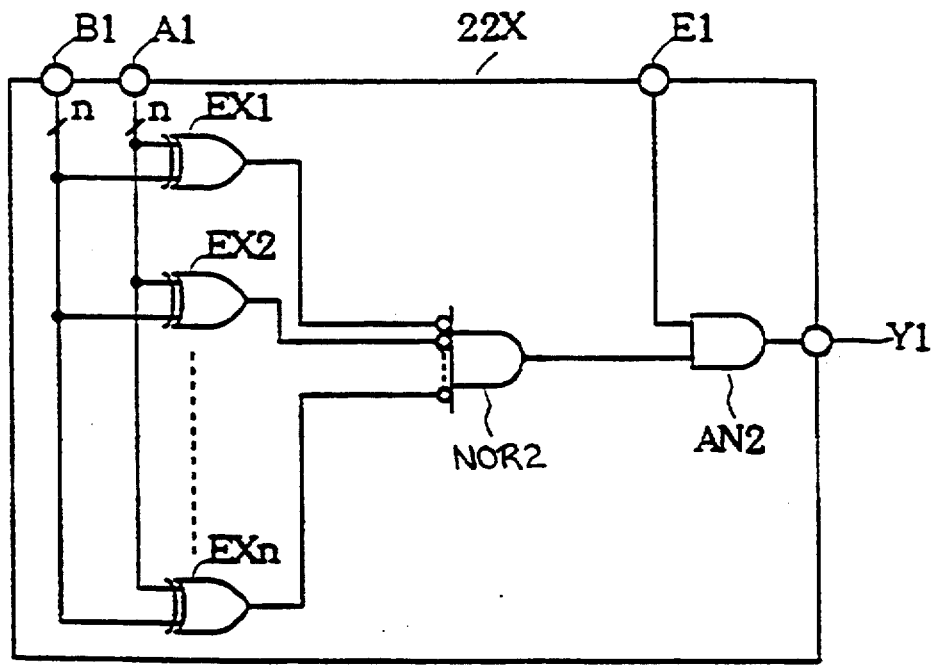

I claim:

1. A semiconductor memory device comprising:
   a data input terminal for receiving data for storage;
   an address signal input terminal for receiving an address signal which designates an address at which said data is written and from which said data is read;
   a main memory circuit for receiving said data from said data input terminal and said address signal from said address signal input terminal and for thereafter writing said data at an address which is specified by said address signal or otherwise retrieving said data already stored therein;
   a defective address specifying circuit for outputting defective address specifying information which specifies an address which corresponds to a defective portion of said main memory circuit;
   a detection circuit for receiving said address signal and said defective address specifying information respectively from said address signal input terminal and said defective address specifying circuit, for detecting whether the address specified by said address signal coincides with the address specified by said defective address specifying information, and for outputting a detection signal indicative of a result of the detection;
   a redundancy memory circuit for receiving said detection signal and said data respectively from said detection circuit and said data input terminal and thereafter storing said data of the defective address in response to said detection signal which indicates the coincidence or otherwise outputting said data about the defective address already stored therein; and
   a data select circuit for receiving said data which is read from said main memory circuit, said data which is outputted from said redundancy memory circuit and said detection signal from said detection circuit and for selectively outputting said data received frown said main memory circuit or said data received from said redundancy memory circuit, in accordance with said detection signal.

2. The semiconductor memory device of claim 1, wherein
   said redundancy memory circuit is constructed to be capable of storing said data about a plurality of defective addresses and outputting all of said stored data about said defective addresses, and
   said data select circuit comprises:
   a first select circuit for receiving said data about said plurality of defective addresses at one time from said redundancy memory circuit and for selectively outputting one of said data about said plurality of defective addresses in accordance with said detection signal; and
   a second select circuit for receiving said data which is retrieved from said main memory circuit and said data which is outputted from said first select circuit and for selectively outputting said data received from said main memory circuit or said data received from said main memory circuit in accordance with said detection signal.

3. The semiconductor memory device of claim 1 which is formed on a semiconductor substrate, wherein said defective address specifying circuit comprises:

a reference coordinate mark which is formed on said semiconductor substrate to indicate the location of said defective address specifying circuit on said semiconductor substrate; and
   a fuse element disposed in a predetermined direction with a predetermined distance away from said reference coordinate mark, said fuse element providing said information which specifies the defective portion when selectively conducted or either disconducted by external manipulation.

4. The semiconductor memory device of claim 1, wherein said data select circuit comprises:
   a plurality of AND circuits for each receiving at one terminal said data which is retrieved from said redundancy memory circuit or said data which is outputted from said main memory circuit and receiving at the other terminal said detection signal, and for generating a logical product of said data received at said one terminal and an noninverted or an inverted logic of said detection signal; and
   an OR circuit for receiving output signals of said plurality of said AND circuits and for outputting a logical sum of said output signals of said plurality of said AND circuits.

5. The semiconductor memory device of claim 1, wherein said redundancy memory circuit comprises latch circuits, each one of said latch circuits storing each bit of said data in accordance with said detection signal, said latch circuits being provided as many as the bit count of said data which is received at said data input terminal.

6. The semiconductor memory device of claim 1, wherein said redundancy memory circuit comprises:
   an address generating circuit for generating a redundancy memory circuit inner address signal which specifies an address within said redundancy memory circuit, in accordance with the detection result indicated by said detection signal; and
   a static random access memory for receiving said redundancy memory circuit inner address signal from said address generating circuit and said data from said data input terminal and for storing said data at the address which is specified by said redundancy memory circuit inner address signal or otherwise outputting said data already stored therein.

7. The semiconductor memory device of claim 3, wherein said reference coordinate mark is any optically readable mark.

8. The semiconductor memory device of claim 7, wherein
   a plurality of said fuse elements are provided, and
   said defective address specifying circuit further comprises:
   a plurality of binary signal generating circuits connected respectively to said fuse elements, said plurality of binary signal generating circuits each detecting whether its associated fuse element is abled or disabled, generating a binary signal in accordance with the result of the detection and outputting said binary signal; and
   a plurality of buffer circuits for receiving the outputs of said plurality of binary signal generating circuits and outputting them to said detection circuit.

9. The semiconductor memory device of claim 8, wherein said defective address specifying information is generated by said plurality of said binary signal generating circuits which correspond to said fuse elements and by said plurality of said buffer circuits which correspond to said binary signal generating circuits.

10. The semiconductor memory device of claim 9, further comprising flag setting means for setting a flag which is used to select whether said defective address specifying information needs to be outputted or not.

11. The semiconductor memory device of claim 8, wherein
said address input terminal includes terminals which have as many junctions as the bit count of said address signal which has a plurality of bits, said bits of said address signal being inputted at the same time, and
said detection circuit comprises:
a plurality of exclusive OR circuits for each receiving at one input terminal each one of said bits of said address signal from its respective junction of said address signal input terminal and for receiving at the other input terminal the output of its associated binary signal generating circuit; and
an AND circuit for receiving outputs of all of said exclusive OR circuits and outputting a logical product of inverted logics of the received outputs received therein as a detection result obtained by said detection circuit.

12. The semiconductor memory device of claim 10, wherein the signal which is outputted from said flag setting means as said flag is generated by one of said fuse elements, one of said binary signal generating circuits and one of said buffer circuits.

13. The semiconductor memory device of claim 12, wherein said binary signal generating circuits each comprise:
a capacitor which is connected between a first power source and a second power source in series with said fuse elements, said first and said second power sources providing different potentials;
a resistor which is connected to said capacitor;
a transistor having one electrode connected to one end of said resistor, the other electrode connected to the other end of said resistor and a control terminal; and
an invertor having an input terminal connected to the other terminal of said transistor and an output terminal connected to said control terminal of said transistor.

14. The semiconductor memory device of claim 10, wherein said fuse elements include fuses which can be blown by a laser.

15. The semiconductor memory device of claim 2, wherein said second select circuit comprises:
judging means for judging in accordance with said detection signal whether said address signal which specifies the defective portion of said main memory circuit is received at said address signal input terminal;
a first AND circuit for receiving an output signal of said judging means at one input terminal and said data which is retrieved from said main memory circuit at the other input terminal and for generating a logical product of an inverted logic of said output signal of said judging means and said data from said main memory circuit;
a second AND circuit for receiving said output signal of said judging means at one input terminal and said data which is retrieved from said redundancy memory circuit at the other input terminal and for generating a logical product of said output signal of said judging means and said data received from said redundancy memory circuit; and
an OR circuit for receiving said output signals of said first and said second AND circuits and generating and outputting a logical sum of them.

16. The semiconductor memory device of claim 15, wherein said first select circuit comprises:
a plurality of third AND circuits for each receiving said data which is outputted from said redundancy memory circuit and said detection signal and for generating a logical product of said data received from said redundancy memory circuit and an non-inverted or an inverted logic of said detection signal; and
an OR circuit for receiving output signals of all of said third AND circuits and generating and outputting a logical sum of them.

17. The semiconductor memory device of claim 16, wherein said judging means includes an OR circuit which receives all of a plurality of bits of said detection signal and generating and outputting a logical sum of them.

* * * * *

UNITED STATES PATENT AND TRADEMARK OFFICE
CERTIFICATE OF CORRECTION

PATENT NO. : 5,353,253
DATED : October 4, 1994
INVENTOR(S) : Michio Nakajima

It is certified that error appears in the above-indentified patent and that said Letters Patent is hereby corrected as shown below:

Column 9, line 60, change ""1"" to --"0" = "L"--;

line 61, change ""1"" to --"0"--.

Column 11, line 10, change "AN1" to --NOR2--, same line, change "AND circuit" to --NOR gate--;

line 16, change "AND circuit AN1" to --NOR gate NOR2--.

The drawing sheet, consisting of Fig. 2, should be deleted to be replaced with the drawing sheet, consisting of Fig. 2, as shown on the attached page.

Signed and Sealed this

Twenty-seventh Day of June, 1995

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,353,253
DATED : October 4, 1994
INVENTOR(S) : Michio Nakajima

It is certified that error appears in the above-indentified patent and that said Letters Patent is hereby corrected as shown below:

F I G. 2